(12) United States Patent
Aoki

(10) Patent No.: US 7,579,635 B2
(45) Date of Patent: Aug. 25, 2009

(54) HETEROJUNCTION BIPOLAR TRANSISTOR

(75) Inventor: Shigetaka Aoki, Osaka (JP)

(73) Assignee: Panasonic Corporation, Osaka (JP)

( * ) Notice: Subject to any disclaimer, the term of this patent is extended or adjusted under 35 U.S.C. 154(b) by 83 days.

(21) Appl. No.: 11/970,089

(22) Filed: Jan. 7, 2008

(65) Prior Publication Data

US 2008/0230808 A1    Sep. 25, 2008

(30) Foreign Application Priority Data

Mar. 20, 2007    (JP) .............................. 2007-072762

(51) Int. Cl.
*H01L 29/737*    (2006.01)
(52) U.S. Cl. .................. 257/197; 257/565; 257/585; 257/590; 257/591; 257/592; 257/593
(58) Field of Classification Search .................. 257/197, 257/565, 585, 590, 591, 592, 593
See application file for complete search history.

(56) References Cited

U.S. PATENT DOCUMENTS

| | | | |
|---|---|---|---|
| 6,847,062 B2 * | 1/2005 | Ohnishi et al. ............... | 257/197 |
| 7,300,849 B2 * | 11/2007 | Enicks et al. ............... | 438/316 |

FOREIGN PATENT DOCUMENTS

| | | |
|---|---|---|
| JP | 6-69225 | 3/1994 |
| JP | WO 02/061820 A1 | 8/2002 |
| JP | 2004-126344 | 4/2004 |
| JP | 2004-128343 | 4/2004 |
| JP | 2004-520711 | 7/2004 |

* cited by examiner

*Primary Examiner*—Wai-Sing Louie
*Assistant Examiner*—Bilkis Jahan
(74) *Attorney, Agent, or Firm*—McDermott Will & Emery LLP

(57) ABSTRACT

A base layer made of SiGe mixed crystal includes a spacer layer formed in contact with a collector layer with no base impurities diffused therein and an intrinsic base layer formed in contact with an emitter layer with base impurities diffused therein. The spacer layer contains C at a low concentration. The intrinsic base layer has a first region containing C at a low concentration on the collector side and a second region containing C at a high concentration on the emitter side.

12 Claims, 10 Drawing Sheets

FIG. 15A
PRIOR ART
FIG. 15B
PRIOR ART
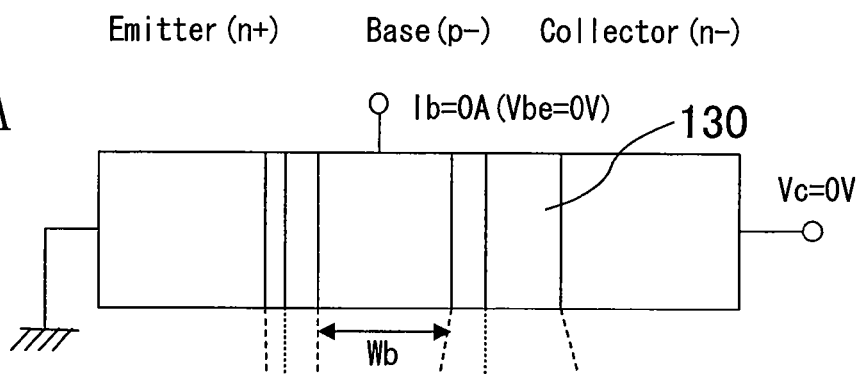
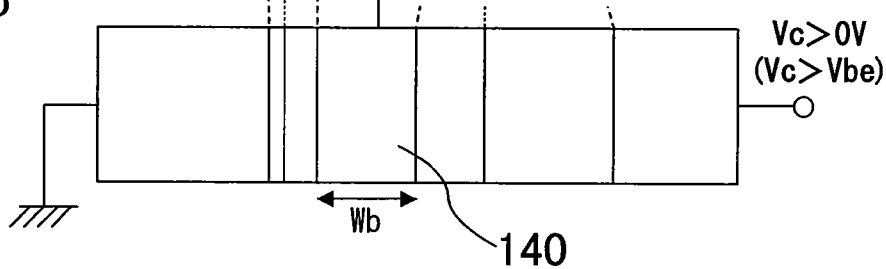

HETEROJUNCTION BIPOLAR TRANSISTOR

BACKGROUND OF THE INVENTION

1. Technical Field of the Invention

The present invention relates to a heterojunction bipolar transistor, and more particularly to a heterojunction bipolar transistor that is small in $h_{FE}$ variations while maintaining a high early voltage.

2. Description of Related Art

In recent years, in bipolar transistors formed using a silicon substrate, efforts have been made to attain higher speed and performance with the progress of submicron technology/self-alignment technology. In particular, SiGe heterojunction bipolar transistors (SiGe-HBTs) whose base layer is a SiGe layer made of mixed crystal of Si and Ge grown on a silicon substrate by epitaxy have been considered highly promising as bipolar transistors permitting further higher speed and performance compared with conventional Si homojunction bipolar transistors (Si-BJTs).

The reason for the above is as follows. Since the band gap of Ge (0.66 eV at room temperature) is smaller than that of Si (1.12 eV at room temperature), the band gap of SiGe mixed crystal is smaller than that of Si. Therefore, by using SiGe mixed crystal smaller in band gap than Si for the base layer, the energy barrier against holes injected from the base layer into the emitter layer can be made higher than the energy barrier against electrons injected from the emitter layer into the base layer. Thus, in the case that the impurity concentrations in the emitter layer and the base layer are made the same between a SiGe-HBT and a Si-BJT, the base current of the SiGe-HBT will be smaller than the base current of the Si-BJT, permitting increase in the current amplification ($h_{FE}$) of the SiGe-HBT. SiGe-HBTs can be fabricated using a conventional Si submicron process except for growth of a SiGe epitaxial layer. It is therefore possible to attain higher performance while maintaining the merits (higher integration and lower cost) of the Si process over compound semiconductors such as GaAs. SiGe-HBTs are therefore useful, in particular, as devices meant for high-speed, high-frequency communication systems such as mobile phones and wireless LAN. Moreover, in recent years, SiGe-HBTs have received attention as output transistors in mobile phone systems, for which compound semiconductors typified by GaAs was conventionally adopted, due to the low-cost nature of SiGe.

Self-aligned bipolar transistors using polysilicon as extraction electrodes have been increasingly put into practical use in the high-frequency field as a transistor structure suitable for high-speed applications because of their easiness in reducing the parasitic capacitance with a fine process.

FIG. 9 is a cross-sectional view showing a general configuration of a conventional SiGe-HBT using polysilicon as an extraction electrode. FIG. 10 is a view showing a profile in the depth direction of the impurity concentrations in the emitter, base and collector and the Ge composition (Ge concentration) in SiGe mixed crystal in a section along line X-X in FIG. 9.

As shown in FIG. 9, an $n^+$ collector buried layer 102, an $n^-$ collector layer 103, a non-doped SiGe spacer layer 104, a $p^-$ SiGe compositionally graded layer 105 and a non-doped Si-cap layer 106 are sequentially grown on a Si substrate 101 by epitaxy.

The non-doped SiGe spacer layer 104 and the $p^-$ SiGe compositionally graded layer 105 constitute an intrinsic base layer. The Ge content in the $p^-$ SiGe compositionally graded layer 105 gradually increases from the emitter side toward the collector side. This causes generation of an internal electric field in the $p^-$ SiGe compositionally graded layer 105, as shown in FIG. 11, allowing minority carriers (electrons) injected from the emitter layer into the base layer to be accelerated with the internal electric field. This shortens the base travel time, and thus a high frequency characteristic can be attained.

The non-doped SiGe spacer layer 104 and the $p^-$ SiGe compositionally graded layer 105 are doped with a minute amount (about 0.1 to 0.2 at %, for example) of carbon (C) atoms. The C atoms in the SiGe epitaxial layer can reduce lattice distortion, and also exert the effect of suppressing accelerated diffusion of B. The reason for this effect is that while the accelerated diffusion of B is known as occurring because interstitial Si generated in Si crystal and B are paired, C atoms have an action of effectively capturing interstitial Si.

A $p^+$ extrinsic base layer 108 and a base polysilicon electrode 107 are formed in the SiGe layer surrounding the intrinsic base layers 104 and 105. An insulating film 112 having a hole is formed on the non-doped Si-cap layer 106, and an $n^+$ emitter polysilicon electrode 110 is formed on the insulating film 112. An emitter diffusion layer 109 is formed on the surface of a portion of the Si-cap layer 106 with the n-type impurities in the emitter polysilicon electrode 110 driven therein by heat treatment. Silicide layers 113 are formed over the surfaces of the base polysilicon electrode 107 and the emitter polysilicon electrode 108, which are connected with metal electrodes 115 via contact plugs 114.

The emitter polysilicon electrode 110 is generally formed by decompressed CVD. Therefore, as shown in FIGS. 12A and 12B, natural oxide films 120 having a size of about 0.1 to 1.0 nm are formed unevenly at the interface between the Si-cap layer 106 and the emitter polysilicon electrode 110 due to cleaning before film formation, involved oxidation during film formation and the like. Such natural oxide films 120 pose an energy barrier against minority carriers (holes) injected from the base layer into the emitter layer, as shown in FIG. 11. The base current is therefore smaller at portions having such interface oxide films 120 than portions having no such interface oxide films. Thus, the base current of the entire transistor varies with the state of existence of the interface oxide films 120, causing a problem of $h_{FE}$ variations. In particular, as the area of the emitter opening is smaller, the unevenness becomes more influential and thus the $h_{FE}$ variations caused by the interface oxide films 120 become more significant. The relative variations between adjacent transistors also increase, and thus the circuit characteristics will be greatly affected.

To address the above problem, Japanese Laid-Open Patent Publication No. 6-69225 (Patent Document 1) discloses a method in which the interface oxide films 120 are partially destroyed by raising the heat treatment temperature during emitter drive-in (ball-up phenomenon) to thereby reduce the $h_{FE}$ variations caused by the interface oxide films 120.

To destroy the interface oxide films 120, heat treatment at about 1050 to 1150° C. is considered necessary to perform drive-in by rapid thermal annealing (RTA), for example. However, if heat treatment at 1000° C. or higher is performed, a SiGe epitaxial film, which has a distortion at the SiGe/Si interface intrinsically, will cause a defect such as crystal dislocation. It is therefore difficult to subject SiGe-HBTs to heat treatment at 1000° C. or higher after formation of a SiGe epitaxial layer. Also, even if the drive-in temperature is raised, it is impossible to completely eliminate the interface oxide films 120. This method therefore will provide no essential solution even though it may improve the degree of variations.

Japanese Laid-Open Patent Publication No. 2004-128343 (Patent Document 2) describes a method in which the concentration of C atoms introduced into the base layers 104 and 105 is increased to reduce the $h_{FE}$ variations caused by the interface oxide films 120. To state specifically, as shown in FIG. 13, the C doped into the base layer at a high concentration (about 0.5 to 1.0 at %, for example) acts as centers of recombination between electrons (injected from the emitter layer into the base layer) and holes in the base layer (neutral base recombination (NBR)). Therefore, as the C doping amount increases, the base current of the SiGe-HBT increases. This increase in base current due to NBR is irrelevant to the natural oxide films 120 at the interface between the emitter polysilicon electrode and the emitter diffusion layer. As the base current increases due to NBR resulting in increase in the proportion of the NBR-induced base current in the entire base current, therefore, the variations in base current due to the interface oxide films 120 will become relatively smaller. In other words, even though the degree of variations in base current due to the interface oxide films 120 remains the same, the entire variations in base current will become small because the entire base current is increased with NBR. As a result, the $h_{FE}$ variations can be reduced.

However, when high-concentration C is introduced into the base layer (with NBR), the early voltage is lower compared with when low-concentration (or no) C is introduced into the base layer (without NBR) as shown in FIG. 14. The reason for this problem is considered as follows.

FIGS. 15A and 15B illustrate expanse of depletion layers at the base/collector and emitter/base junctions with the emitter being grounded in a SiGe-HBT, where FIG. 15A shows the state during halts and FIG. 15B shows the state during operation. During operation, with increase in collector potential, a reverse bias is applied between collector/base, reducing the base width Wb of a neutral base layer (non-depleted electrically neutral region in the intrinsic base layer) (early effect). This reduces the total C content in the neutral base layer and thus reduces the base current using C as recombination centers. At this time, to keep the base current fixed, the base potential (Vbe) increases, which increases injection of minority carriers (electrons) from the emitter into the base, and thus increases the collector current. In other words, the collector current has collector voltage dependency caused by C recombination, in addition to the effect of normal reduction in base width Wb (early effect). Thus, the early voltage becomes lower compared with the case without NBR.

During the emitter drive-in, a large amount of interstitial Si is injected from the emitter polysilicon electrode 110 into the emitter diffusion layer 109, the Si-cap layer 106 and the p⁻ SiGe compositionally graded layer (intrinsic base layer) 105. During this injection, accelerated diffusion of B occurs with the interstitial Si, allowing B in the intrinsic base layer 105 to expand toward the collector and emitter sides as shown in FIG. 17A. If regions low in B concentration are formed near the base/collector junction, the depletion layer will change greatly along with the collector potential in these regions. This will further worsen the decrease in early voltage due to NBR.

To solve the above problem, Japanese Laid-Open Patent Publication No. 2004-128344 (Patent Document 3) describes a method in which the p⁻ SiGe compositionally graded layer 105 (B-doped layer) is doped with C at a high concentration (about 0.5 to 1.0 at %, for example) while the SiGe spacer layer 104 (B-non-doped layer) is doped with C at a low concentration (about 0.1 to 0.2 at %, for example), to thereby suppress the decrease in early voltage while reducing the $h_{FE}$ variations.

In other words, while the base current is increased with the high-concentration C in the p⁻ SiGe compositionally graded layer (B-doped layer) 105 to thereby reduce the effect of the interface oxide films, the C concentration in the region into which B has expanded by the accelerated diffusion of B toward the collector side is reduced to thereby reduce the effect of NBR. In this way, it is possible to suppress the decrease in early voltage while reducing the $h_{FE}$ variations.

SUMMARY OF THE INVENTION

However, the method described in Patent Document 3 fails to be sufficiently effective in solving the following problem that may occur with achievement of finer transistors. It is therefore difficult to obtain a high early voltage in fine transistors.

In general, doping of the extrinsic base layer 108 and the base polysilicon electrode 107 with p-type impurities is often made in a self-aligned manner by ion implantation using the emitter polysilicon electrode 110 as a mask after patterning of the emitter polysilicon electrode 110. During this doping, in which ion implantation is made with a dose amount of about 1E15 to 5E15 cm⁻³, the crystal lattice is disturbed in the extrinsic base layer 108 and near the boundary between the extrinsic base layer 108 and the intrinsic base layer 105, generating a large amount of interstitial Si. With the interstitial Si, accelerated diffusion of B toward the depth of the extrinsic base layer 108 is prompted. At the same time, since interstitial Si also diffuses laterally (toward the intrinsic base layer 105), the accelerated diffusion of B becomes especially eminent in the portion of the intrinsic base layer 105 near the extrinsic base layer 108 (region A) as shown in FIG. 16.

Therefore, while a transistor will be wide in base width as shown in FIG. 17A in a region along line XIVa-XIVa in FIG. 16, the transistor will be low in B concentration and wide in base width, as shown in FIG. 17B, in a region A along line XIVb-XIVb in FIG. 16. In particular, in the portion of the transistor formed in the region A, which is low in B concentration and wide in base width, the depletion layer will change greatly along with the collector potential, and thus the decrease in early voltage due to NBR will be eminent.

In addition, when the p⁻ SiGe compositionally graded layer (B-doped layer) 105 is doped with C at a high concentration, the decrease in early voltage due to NBR will further be great in the region A because the B concentration in the p⁻ SiGe compositionally graded layer 105 has become greatly low.

As described above, in the SiGe-HBT in which the extrinsic base layer 108 is formed in a self-aligned manner with respect to the emitter polysilicon electrode 110, an effect of reducing the $h_{FE}$ variations can be obtained by doping the p⁻ SiGe compositionally graded layer 105 with C at a high concentration, but there arises a problem that the decrease in early voltage due to NBR becomes eminent. In particular, as the distance X between the intrinsic base layer and the extrinsic base layer becomes smaller with achievement of finer transistors, as shown in FIG. 16, the decrease in early voltage will further become eminent.

A major object of the present invention is providing a heterojunction SiGe bipolar transistor in which the $h_{FE}$ variations are small while the decrease in early voltage due to NBR caused by accelerated diffusion of B is suppressed.

To attain the above object, the heterojunction bipolar transistor of the present invention is a heterojunction bipolar transistor having a base layer made of SiGe mixed crystal, the base layer including: a spacer layer formed in contact with a collector layer with no base impurities diffused therein; and an intrinsic base layer formed in contact with an emitter layer with base impurities diffused therein, wherein the spacer layer contains C at a first concentration, the intrinsic base layer includes: a first region containing C at a second concentration on the collector side; and a second region containing C at a third concentration on the emitter side, and the third concentration is higher than the first concentration and the second concentration.

The second region may be in contact with the emitter layer. Otherwise, the second region may have a region in which the C concentration decreases from the emitter side toward the collector side in a portion closer to the first region.

In a preferred embodiment, the intrinsic base layer further includes a third region between the second region and the emitter layer, the third region contains C at a fourth concentration, and the fourth concentration is lower than the third concentration.

The second region may have a region in which the C concentration increases from the emitter side toward the collector side in a portion closer to the third region.

In another preferred embodiment, the spacer layer has a high-concentration region containing C at a concentration higher than the first concentration in a portion closer to the collector layer.

The high-concentration region may have a graded region in which the C concentration increases from the emitter side toward the collector side in a portion closer to the intrinsic base layer.

In yet another preferred embodiment, the first and second concentrations are in a range of 0.05 to 0.3 at %. The third concentration may be in a range of 0.4 to 2.0 at %. The fourth concentration may be in a range of 0.4 to 2.0 at %.

In yet another preferred embodiment, a cap layer made of Si is formed on the base layer, an emitter electrode made of polycrystalline Si with emitter impurities diffused therein is formed on the cap layer, and an emitter layer containing emitter impurities diffused from the emitter electrode is formed in the cap layer.

An extrinsic base layer made of SiGe mixed crystal may be formed on the side of the base layer, and the extrinsic base layer may be formed in a self-aligned manner by ion implantation using the emitter electrode as a mask.

According to the present invention, a heterojunction bipolar transistor having a base layer made of SiGe mixed crystal that secures a high early voltage and is small in $h_{FE}$ variations can be implemented.

BRIEF DESCRIPTION OF THE DRAWINGS

FIGS. 15A and 15B are views illustrating expanse of depletion layers at the base/collector and emitter/base junctions in a conventional SiGe-HBT during halts and during operation, respectively.

DESCRIPTION OF THE PREFERRED EMBODIMENTS

Figure 1:
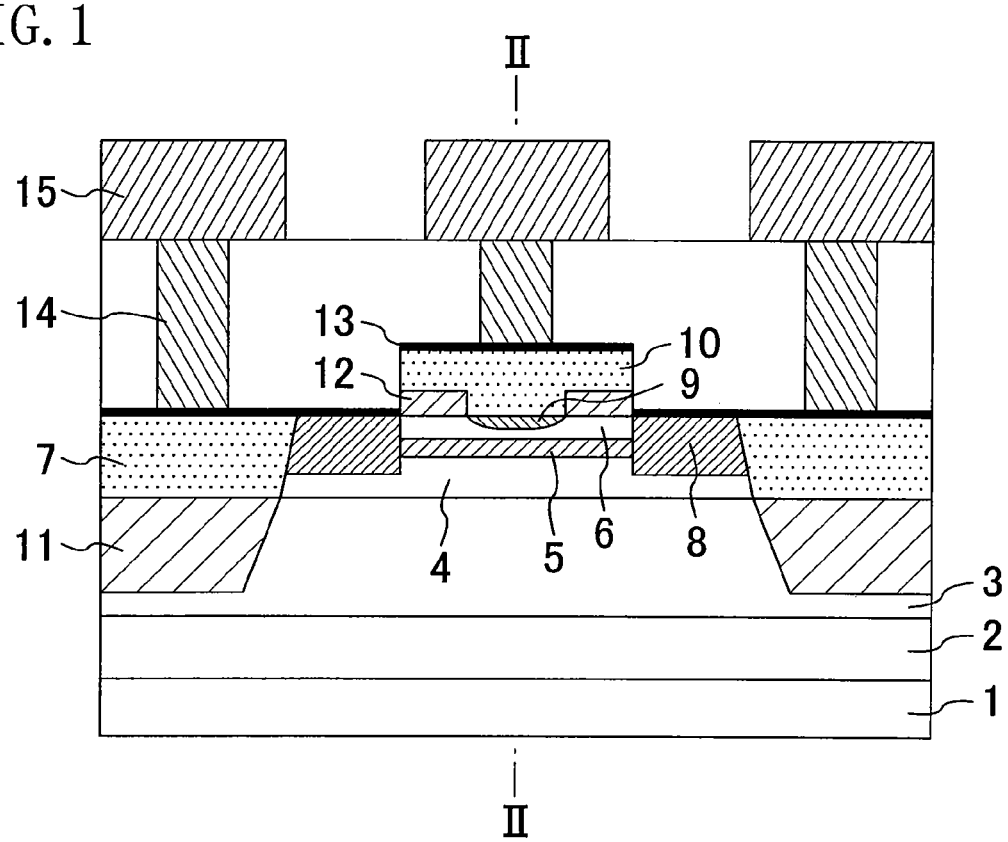
FIG. 1 is a cross-sectional view of a heterojunction bipolar transistor of Embodiment 1 of the present invention.

Hereinafter, preferred embodiments of the present invention will be described with reference to the accompanying drawings. Note that for simplification of description, components having substantially the same functions are denoted by the same reference numerals. It should also be noted that the present invention is not limited to the embodiments to follow.

Embodiment 1

FIG. 1 is a cross-sectional view diagrammatically showing a heterojunction bipolar transistor of Embodiment 1 of the present invention.

As shown in FIG. 1, an n$^+$ collector buried layer 2 doped with impurities such as phosphorus (P) at a high concentration (about 1E20 cm$^{-3}$, for example) and an n collector layer 3 doped with impurities such as P by epitaxial at a low concentration (about 1E16 cm$^{-3}$, for example) are formed on a Si substrate 1. On the n collector layer 3, sequentially formed are a non-doped SiGe spacer layer 4, a p$^-$ SiGe intrinsic base layer 5 doped with impurities such as boron (B) and a non-doped Si-cap layer 6.

An insulating film 12 having an opening is formed on the Si-cap layer 6, and an emitter polysilicon electrode 10 doped with n-type impurities such as P at a high concentration (1E20 cm$^{-3}$ or more, for example) is formed on the insulating film 12. After the formation of the emitter polysilicon electrode 10, heat treatment is performed at a temperature of about 900 to 1000° C. to allow the n-type impurities in the emitter polysilicon electrode 10 to diffuse into a portion of the non-doped Si-cap layer 6, to thereby form an emitter diffusion layer 9.

Note that the thickness of the SiGe spacer layer 4 is set so that the p-type impurities are prevented from diffusing from the SiGe intrinsic base layer 5 into the n$^-$ collector layer 3 by the above heat treatment. The SiGe spacer layer therefore serves as a base layer. An extrinsic base layer 8 and a base extraction electrode (base polysilicon electrode) 7 both doped with p-type impurities such as B are formed in the SiGe layer surrounding the SiGe intrinsic base layer 5. The B concentrations in the extrinsic base layer 8 and the base extraction electrode 7 are made to be higher (1E20 cm$^{-3}$ or more, for example) than the B concentration in the SiGe intrinsic base layer (about 5E18 to 5E19 cm$^{-3}$, for example) for the purpose of reducing the base parasitic resistance of the bipolar transistor.

Silicide layers 13 made of cobalt (Co) silicide and the like are formed over the surfaces of the base polysilicon electrode 7 and the emitter polysilicon electrode 10 for reducing the contact resistance with metal electrodes 15, and are connected with the metal electrodes 15 via contact plugs 14 filled with tungsten (W) and the like.

Specifically, the n⁻ collector layer 3 is epitaxially grown to a thickness of 0.1 μm to 1.0 μm, the SiGe spacer layer 4 to a thickness of 5 nm to 50 nm, the p⁻ SiGe intrinsic base layer 5 to a thickness of 5 nm to 50 nm and the Si-cap layer 6 to a thickness of 10 nm to 100 nm.

Figure 2:
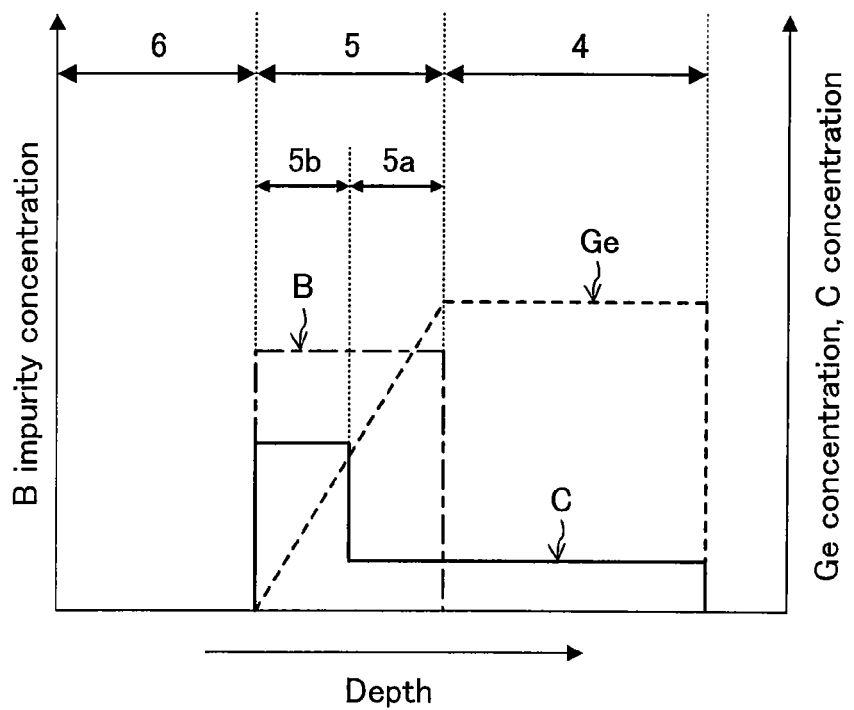
FIG. 2 is a view showing a profile in the depth direction of the B impurity concentration, the Ge concentration and the C concentration in SiGe base layers along line II-II in FIG. 1.

FIG. 2 is a view showing a profile in the depth direction of the B impurity concentration in the base layer made of SiGe mixed crystal, the Ge composition (Ge concentration) in the SiGe mixed crystal and the concentration of C contained in the SiGe mixed crystal in a section along line II-II in FIG. 1.

As shown in FIG. 2, the SiGe spacer layer 4 contains C at a low concentration (first concentration). The SiGe intrinsic base layer 5 has a first region 5a containing C at a low concentration (second concentration) on the collector side and a second region 5b containing C at a high concentration (third concentration) on the emitter side. Note that although the SiGe intrinsic layer 5 is shown as a Ge graded layer in which the Ge composition increases from the emitter side toward the collector side, it is not necessarily a Ge-graded layer.

Hereinafter, effects obtained by allowing the SiGe spacer layer 4 and the SiGe intrinsic base layer 5 to contain C in the concentration profile described above will be described.

The C contained at a high concentration in the emitter-side second region 5b of the SiGe intrinsic base layer 5 effectively acts as centers of NBR between electrons and holes. This increases the base current of the SiGe-HBT, resulting in increasing the proportion of the NBR-induced base current in the entire base current and thus relatively reducing the variations in base current due to the interface oxide films. In other words, even though the degree of variations in base current due to the interface oxide films 120 remains the same, the entire variations in base current will become small because the entire base current is increased with NBR. As a result, the h$_{FE}$ variations will be reduced.

The C contained at a low concentration in the SiGe spacer layer 4 serves to suppress the accelerated diffusion of B in the depth direction in the SiGe intrinsic base layer 5, and also can effectively suppress accelerated diffusion of B near the extrinsic base layer 8 by capturing interstitial Si diffusing laterally from the extrinsic base layer 8.

Moreover, in the SiGe intrinsic base layer 5 doped with B at a high concentration, the first region 5a closer to the SiGe spacer layer 4 contains C at a low concentration, and thus can provide the effect of suppressing the accelerated diffusion of B by capturing interstitial Si diffusing laterally from the extrinsic base layer 8.

Note that with the low C concentration in the first region 5a, even if the base width varies with expanse of the depletion layer along with increase in collector potential, the decrease in early voltage due to NBR will be small, causing no substantial influence, because the variation in the C concentration in the neutral base layer is small.

The C concentrations in the SiGe spacer layer 4 and the first region 5a of the SiGe intrinsic base layer 5 are preferably in the range of 0.05 to 0.3 at %. With a C concentration of 0.05 at % or more, the effect of suppressing the accelerated diffusion of B can be obtained. With a C concentration of 0.3 at % or less, there will be substantially no problem of decrease in early voltage due to NBR.

The C concentration in the second region 5b of the SiGe intrinsic base layer 5 is preferably in the range of 0.4 to 2.0 at %. With a C concentration of 0.4 at % or more, the effect of reducing the h$_{FE}$ variations due to NBR will be obtained. With a C concentration of 2.0 at % or less, there will be no problem of degradation in the crystallinity of the SiGe epitaxial film.

The C concentrations in the SiGe spacer layer 4 and the first region 5a of the SiGe intrinsic base layer 5 are not necessarily the same. Since the B concentration after the accelerated diffusion is smaller in the SiGe spacer layer 4 than in the first region 5a of the SiGe intrinsic base layer 5, the depletion layer changes along with the collector potential more greatly in the SiGe spacer layer 4. Thus, the C concentration in the SiGe spacer layer 4 is preferably smaller than the C concentration in the first region 5a of the SiGe intrinsic base layer 5.

The effect of suppressing the decrease in early voltage can be obtained with no C contained in the SiGe spacer layer 4 as long as the low C concentration layer 5a and the high C concentration layer 5b are formed in the B-doped Ge graded layer, although the effect of suppressing the accelerated diffusion of B decreases.

Figure 3:
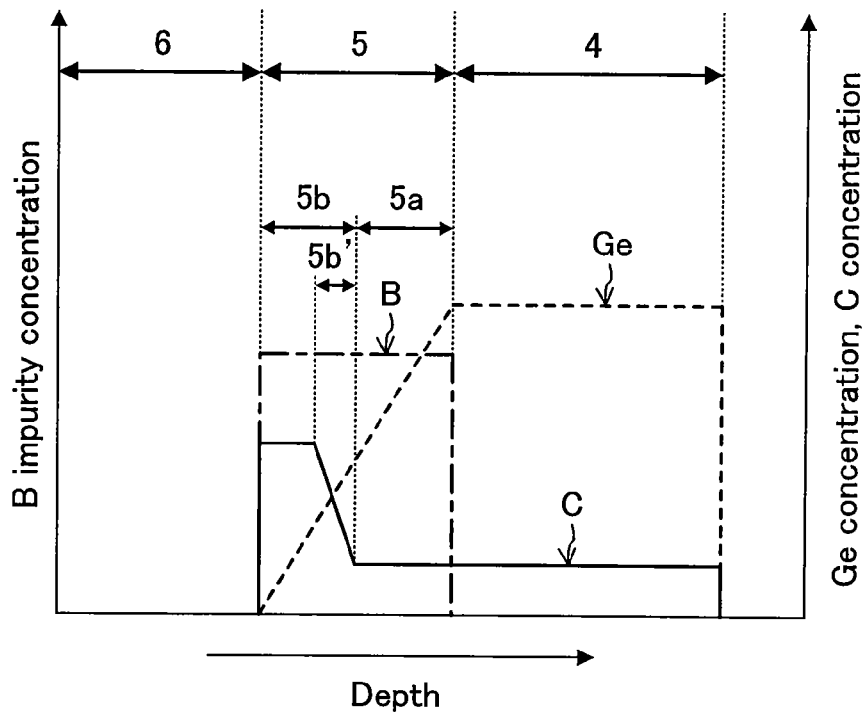
FIG. 3 is a view showing an alteration to Embodiment 1.

FIG. 3 is a view showing an alteration to Embodiment 1. As shown in FIG. 3, the second region 5b of the SiGe intrinsic base layer 5 has a region 5b' in a portion thereof closer to the first region 5a, in which the C concentration decreases from the emitter side toward the collector side. With the region 5b' having a graded C concentration, in which the C concentration in the collector-side portion of the high C concentration region gradually decreases from the emitter side toward the collector side, it is possible to minimize the variation in the C concentration contained in the neutral base layer even if the depletion layer expands along with increase in collector potential and thus suppress the decrease in early voltage, while maintaining the effect of suppressing the accelerated diffusion of B.

Embodiment 2

Figure 4:
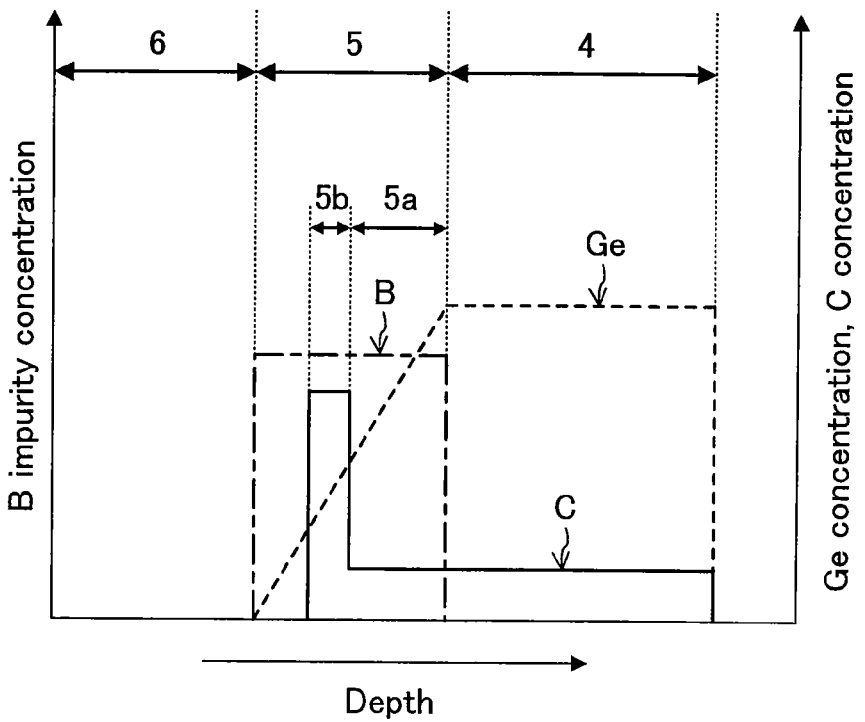
FIG. 4 is a view showing a profile in the depth direction of the B impurity concentration, the Ge concentration and the C concentration in SiGe base layers in Embodiment 2 of the present invention.

FIG. 4 is a view showing a profile in the depth direction of the B impurity concentration in the base layer made of SiGe mixed crystal, the Ge concentration in the SiGe mixed crystal and the concentration of C contained in the SiGe mixed crystal in Embodiment 2 of the present invention. Embodiment 2 is different from Embodiment 1 in that while the second region 5b of the SiGe intrinsic base layer 5 was formed in contact with the Si-cap layer (emitter layer) 6 in Embodiment 1, it is formed apart from the Si-cap layer 6 in this embodiment.

In this embodiment, the following effect can be obtained in addition to the effect obtained in Embodiment 1.

With the C-free region provided in a portion of the SiGe intrinsic base layer 5 closer to the Si-cap layer (emitter layer) 6, the C concentration in the neutral base layer will remain unchanged even if the depletion layer changes along with an emitter-base potential change. This can further suppress the decrease in early voltage.

Figure 5:
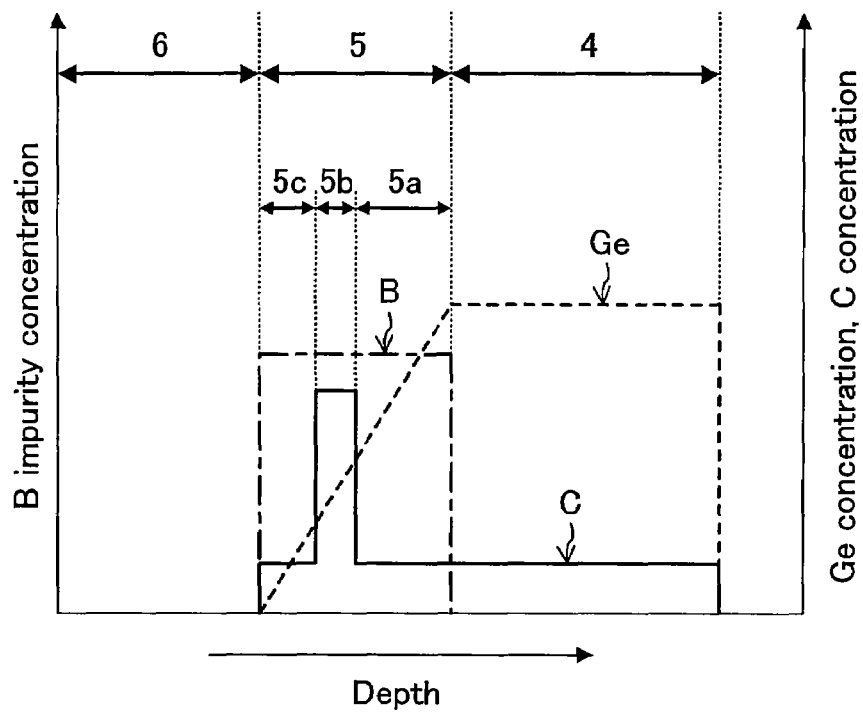
FIG. 5 is a view showing an alteration to Embodiment 2.

FIG. 5 shows an alteration to this embodiment, in which a third region 5c containing C at a low concentration (fourth concentration) is provided in a portion of the SiGe intrinsic base layer 5 closer to the Si-cap layer (emitter layer) 6. With the C in the third region 5c, the effect of suppressing the accelerated diffusion of B can be obtained, and also the decrease in early voltage can be further suppressed.

Figure 6:
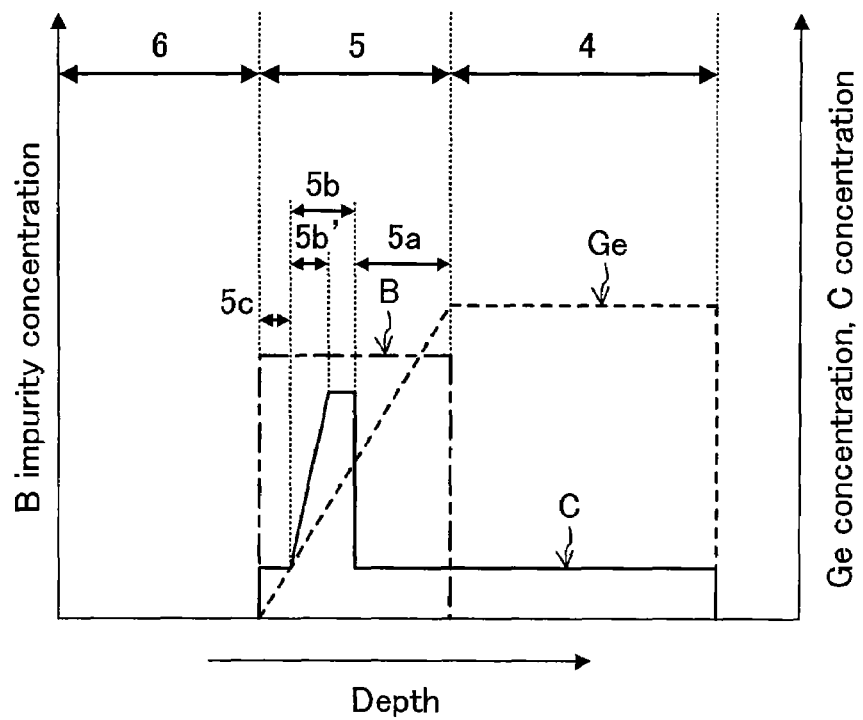
FIG. 6 is a view showing another alteration to Embodiment 2.

Alternatively, as shown in FIG. 6, the second region 5b of the SiGe intrinsic base layer 5 may have a region 5b' in a portion thereof closer to the third region 5c, in which the C concentration increases from the emitter side toward the collector side. This makes it possible to suppress the variation in the C concentration contained in the neutral base layer even if the depletion layer changes along with an emitter-base potential change and thus further suppress the decrease in early voltage, while maintaining the effect of suppressing the accelerated diffusion of B.

The C concentration in the third region 5c of the SiGe intrinsic base layer 5 is preferably in the range of 0.05 to 0.3 at %. With a C concentration of 0.05 at % or more, the effect of suppressing the accelerated diffusion of B will be obtained. With a C concentration of 0.3 at % or less, there will be substantially no problem of decrease in early voltage due to NBR.

The C concentrations in the SiGe spacer layer 4 and the regions 5a and 5b of the SiGe intrinsic base layer 5 can be values falling within the ranges specified in Embodiment 1.

Embodiment 3

Figure 7:
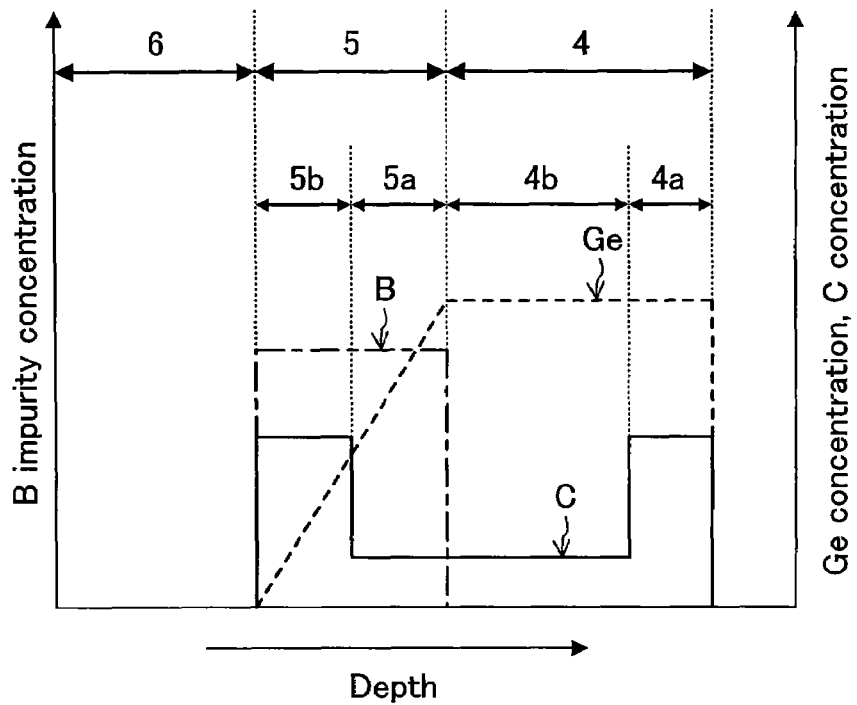
FIG. 7 is a view showing a profile in the depth direction of the B impurity concentration, the Ge concentration and the C concentration in SiGe base layers in Embodiment 3 of the present invention.

FIG. 7 is a view showing a profile in the depth direction of the B impurity concentration in the base layer made of SiGe mixed crystal, the Ge concentration in the SiGe mixed crystal and the concentration of C contained in the SiGe mixed crystal in Embodiment 3 of the present invention. Embodiment 3 is different from Embodiment 1 in that while the C concentration (first concentration) in the SiGe spacer layer 4 was kept constant in Embodiment 1, the SiGe spacer layer 4 has a high-concentration region 4a containing C at a higher concentration than the first concentration in a portion thereof closer to the collector layer in this embodiment.

In this embodiment, the following effect can be obtained in addition to the effect obtained in Embodiment 1.

In the SiGe-HBT, the Ge content sharply increases at the interface between the n⁻ collector layer 3 and the SiGe spacer layer 4, and this causes a large lattice distortion. At this boundary, therefore, a crystal defect such as dislocation is likely to occur. By introducing C small in atomic diameter into the neighborhood of this interface, however, the lattice distortion can be reduced, and thus a high-quality SiGe-HBT can be implemented. Since the high-concentration region 4a is sufficiently away from the B-doped region (SiGe intrinsic base layer 5), the accelerated diffusion of B won't reach the high-concentration region 4a, and thus no decrease in early voltage due to NBR will occur.

The C concentration in the high-concentration region 4a of the SiGe spacer layer 4 may be determined depending on the amount of lattice distortion occurring with the Ge composition. Preferably, the C concentration may be 2 at % or less because if it is high, the crystallinity will be degraded due to generation of SiC microcrystal and the like.

Figure 8:
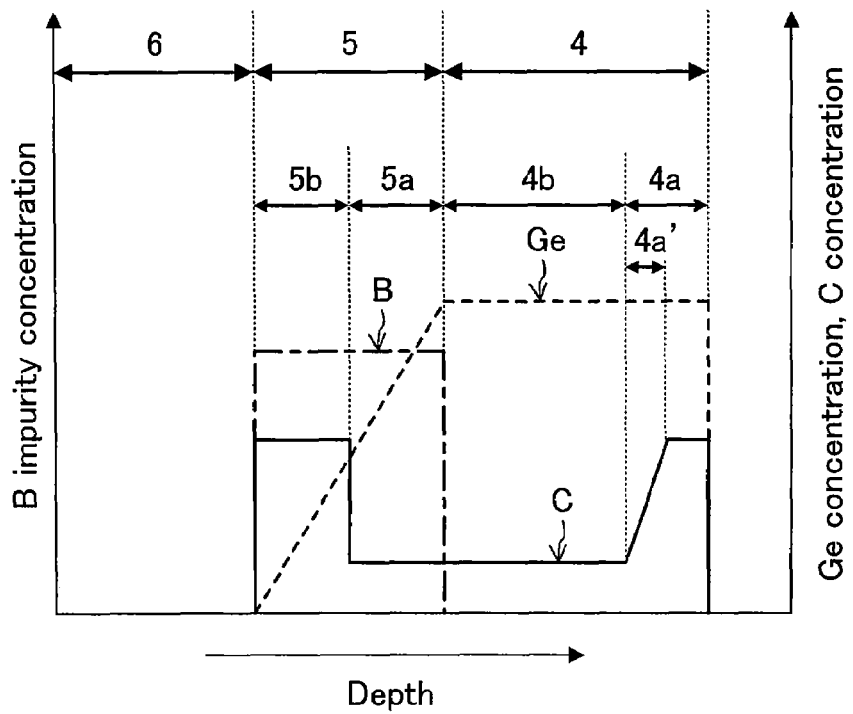
FIG. 8 is a view showing an alteration to Embodiment 3.
Figure 9:
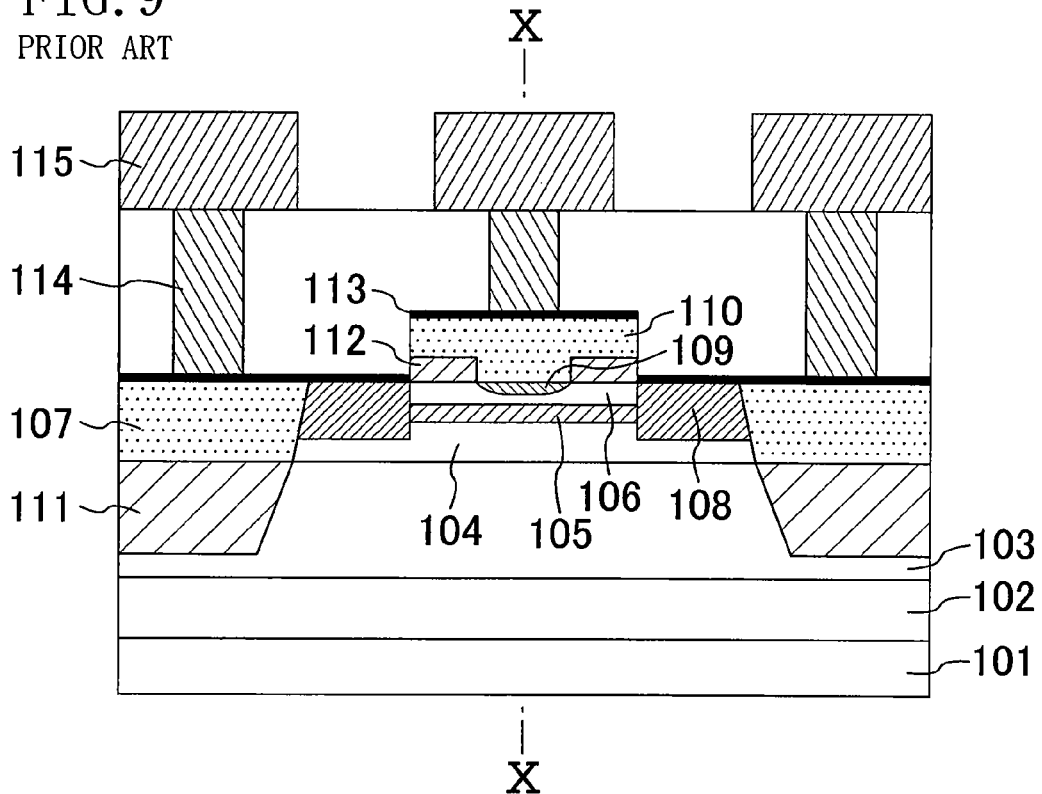
FIG. 9 is a cross-sectional view of a conventional SiGe-HBT.
Figure 10:
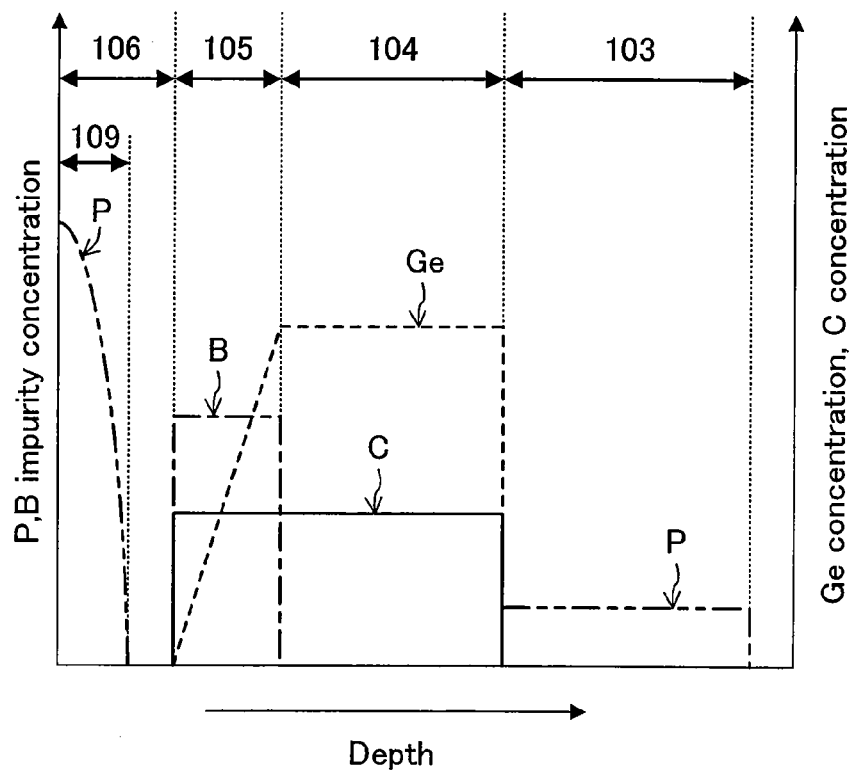
FIG. 10 is a view showing a profile in the depth direction of the B impurity concentration, the Ge concentration and the C concentration in SiGe base layers along line X-X in FIG. 9.
Figure 11:
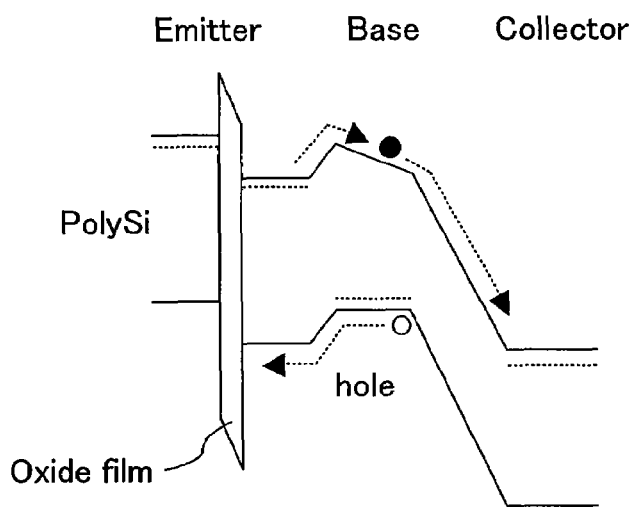
FIG. 11 is a view showing an energy band of a conventional SiGe-HBT.
Figure 12A:
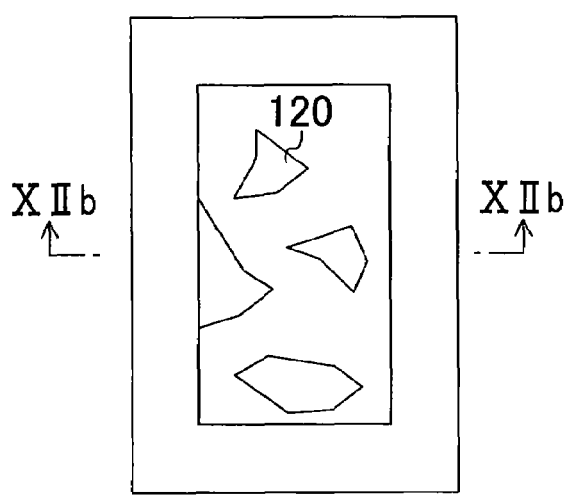
FIG. 12A is a plan view of a polysilicon/emitter boundary in the conventional SiGe-HBT.
Figure 12B:
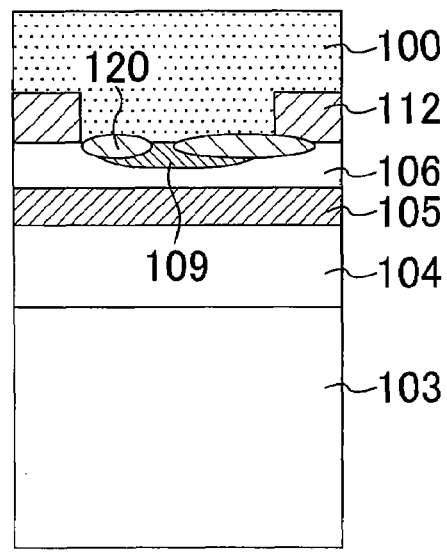
FIG. 12B is a cross-sectional view taken along line XIIb-XIIb in FIG. 12A.
Figure 13:
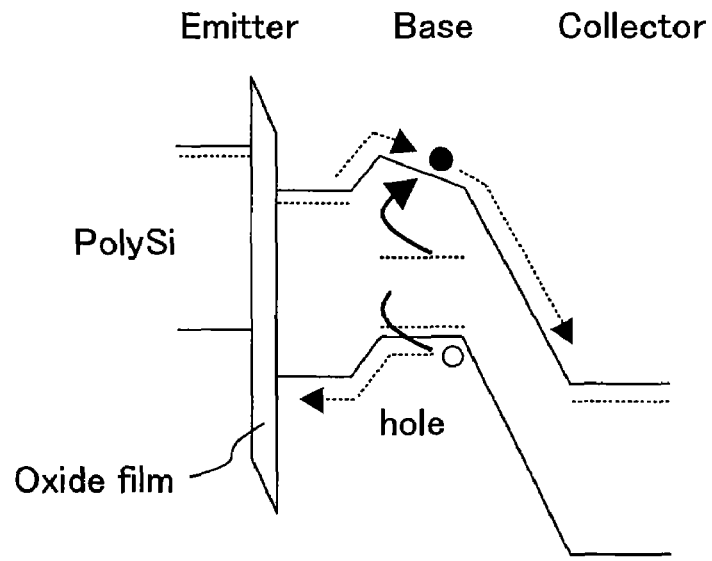
FIG. 13 is a view showing an energy band of a conventional SiGe-HBT.
Figure 14:
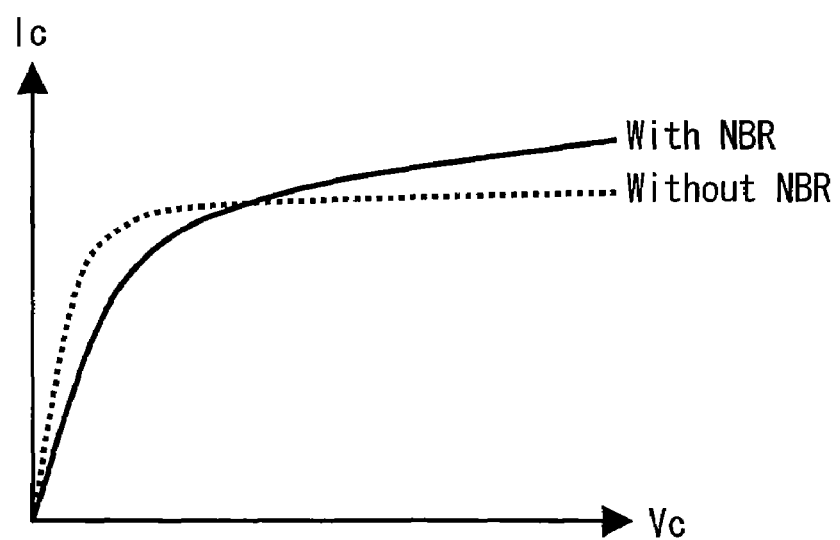
FIG. 14 is a view showing output characteristics of conventional SiGe-HBTs.
Figure 16:
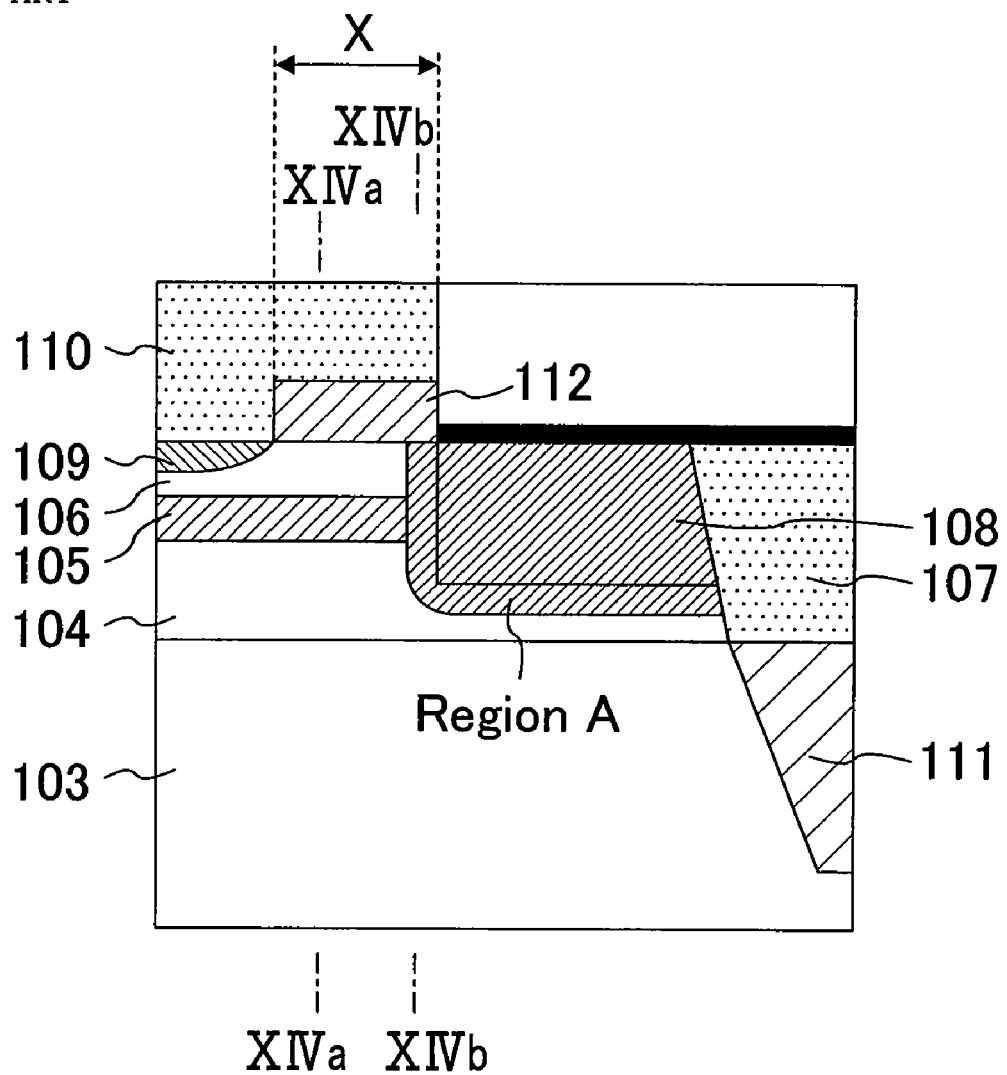
FIG. 16 is a partial cross-sectional view showing an extrinsic base layer and its surroundings of the conventional SiGe-HBT.
Figure 17A:
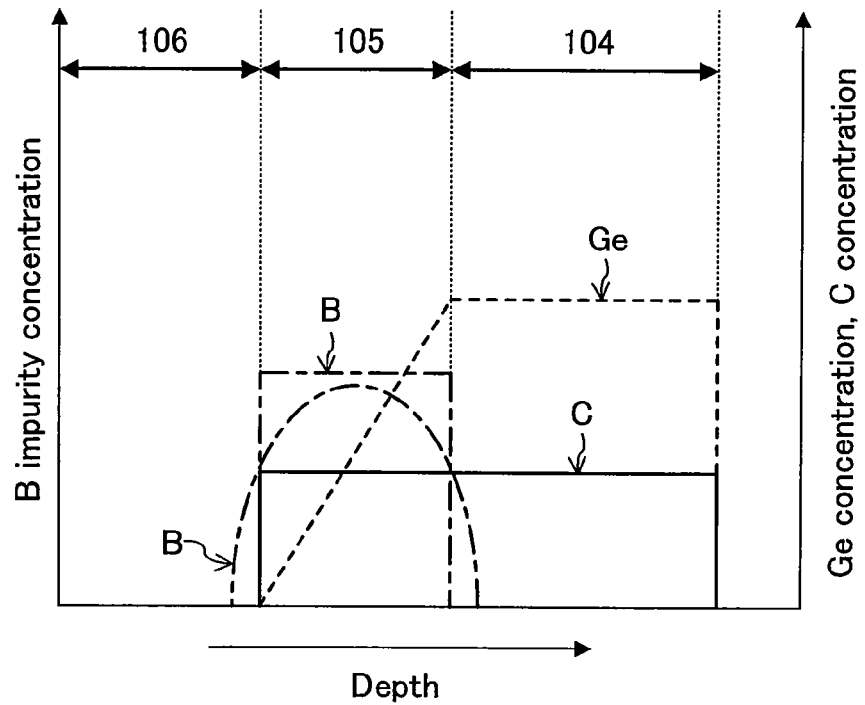
FIGS. 17A and 17B are views showing accelerated diffusion of B in the sections along line XIVa-XIVa and line XIVb-XIVb, respectively, in FIG. 16.
Figure 17B:
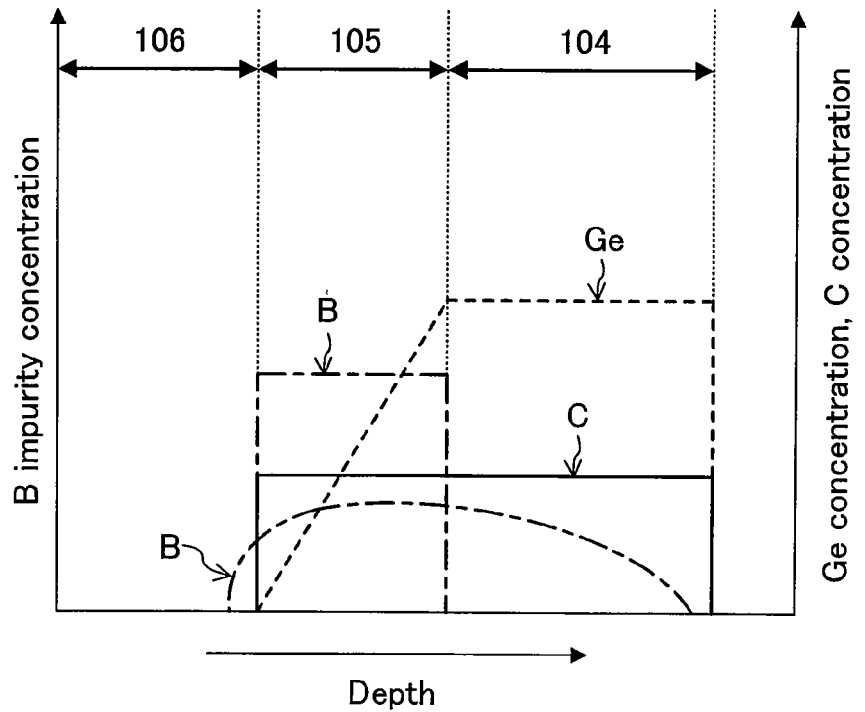

FIG. 8 shows an alteration to this embodiment, in which the high-concentration region 4a has a graded region 4a' in a portion thereof closer to the SiGe intrinsic base layer 5, in which the C concentration increases from the emitter side toward the collector side. With the graded region 4a' having a graded C concentration, it is possible to minimize the amount of change in the C concentration in the neutral base layer even if the base width changes with expanse of the depletion layer along with increase in collector potential, and thus the decrease in early voltage due to NBR can be suppressed, while maintaining the effect of suppressing accelerated diffusion of B.

With the C concentration in the graded region 4a' of the SiGe spacer layer 4 being higher as the distance from the base is greater (as the position is deeper), the effect of suppressing the accelerated diffusion of B can be obtained in a region in which B may diffuse more deeply with the accelerated diffusion. Therefore, it is also possible to obtain the effect of making the B diffusion depth uniform over the entire base layer (minimizing the difference in diffusion depth between the neighborhood of the intrinsic base and the neighborhood of the extrinsic base).

While the present invention has been described in preferred embodiments, it should be noted that the embodiments described above are not restrictive, but can be modified in various ways. For example, any of the alterations described in the respective embodiments can also be applied to the other embodiments. In Embodiment 1, for example, the region 5b' having a graded C concentration was provided in a portion of the second region 5b of the SiGe intrinsic base layer 5. Such a region in which the C concentration decreases from the emitter side toward the collector side may also be provided in a portion of the second region 5b of the SiGe intrinsic base layer 5 in Embodiment 2.

What is claimed is:

1. A heterojunction bipolar transistor having a base layer made of SiGe mixed crystal, the base layer comprising:
   a spacer layer formed in contact with a collector layer with no base impurities diffused therein; and
   an intrinsic base layer formed in contact with an emitter layer with base impurities diffused therein,
   wherein the spacer layer contains C at a first concentration, the intrinsic base layer comprises:
   a first region containing C at a second concentration on the collector side; and
   a second region containing C at a third concentration on the emitter side, and
   the third concentration is higher than the first concentration and the second concentration.

2. The heterojunction bipolar transistor of claim 1, wherein the second region is in contact with the emitter layer.

3. The heterojunction bipolar transistor of claim 1, wherein the second region has a region in which the C concentration decreases from the emitter side toward the collector side in a portion closer to the first region.

4. The heterojunction bipolar transistor of claim 1, wherein the intrinsic base layer further comprises a third region between the second region and the emitter layer, and
   the third region contains C at a fourth concentration, and the fourth concentration is lower than the third concentration.

5. The heterojunction bipolar transistor of claim 4, wherein the second region has a region in which the C concentration increases from the emitter side toward the collector side in a portion closer to the third region.

6. The heterojunction bipolar transistor of claim 1, wherein the spacer layer has a high-concentration region containing C at a concentration higher than the first concentration in a portion closer to the collector layer.

7. The heterojunction bipolar transistor of claim 6, wherein the high-concentration region has a graded region in which the C concentration increases from the emitter side toward the collector side in a portion closer to the intrinsic base layer.

8. The heterojunction bipolar transistor of claim 1, wherein the first and second concentrations are in a range of 0.05 to 0.3 at %.

9. The heterojunction bipolar transistor of claim 1, wherein the third concentration is in a range of 0.4 to 2.0 at %.

10. The heterojunction bipolar transistor of claim 4, wherein the fourth concentration is in a range of 0.4 to 2.0 at %.

11. The heterojunction bipolar transistor of claim 1, wherein a cap layer made of Si is formed on the base layer,
an emitter electrode made of polycrystalline Si with emitter impurities diffused therein is formed on the cap layer, and
an emitter layer containing emitter impurities diffused from the emitter electrode is formed in the cap layer.

12. The heterojunction bipolar transistor of claim 11, wherein an extrinsic base layer made of SiGe mixed crystal is formed on the side of the base layer, and
the extrinsic base layer is formed in a self-aligned manner by ion implantation using the emitter electrode as a mask.

* * * * *

UNITED STATES PATENT AND TRADEMARK OFFICE
CERTIFICATE OF CORRECTION

PATENT NO. : 7,579,635 B2  Page 1 of 1
APPLICATION NO. : 11/970089
DATED : August 25, 2009
INVENTOR(S) : Shigetaka Aoki It is certified that error appears in the above-identified patent and that said Letters Patent is hereby corrected as shown below:

ON THE TITLE PAGE:

Item "(56) References Cited", under "FOREIGN PATENT DOCUMENTS", change the reference "JP   2004-126344   4/2004" to --JP   2004-128344   4/2004--.

Signed and Sealed this

Twenty-fourth Day of November, 2009

David J. Kappos
*Director of the United States Patent and Trademark Office*